United States Patent
Pai et al.

(10) Patent No.: US 6,261,861 B1
(45) Date of Patent: Jul. 17, 2001

(54) PROCESSING FLOW OF A COMPLEMENTARY METAL-OXIDE SEMICONDUCTOR COLOR FILTER

(75) Inventors: Yuan-Chi Pai, Nantou; Hua-Jen Cheng, Yung-Kang; Wei-Chiang Lin, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/112,950

(22) Filed: Jul. 9, 1998

(30) Foreign Application Priority Data

Jun. 4, 1998 (TW) ................................................ 87108824

(51) Int. Cl.[7] ................................................ H01L 21/312
(52) U.S. Cl. ........................... 438/70; 438/710; 438/725; 438/65
(58) Field of Search .................. 430/29, 30, 60, 430/66, 67, 68, 69, 70; 257/53, 290, 291, 292, 293, 369, 431, 432, 433, 434, 435; 438/710, 725

(56) References Cited

U.S. PATENT DOCUMENTS

| | | | |
|---|---|---|---|
| 5,321,249 | * | 6/1994 | Nomura ............................ 250/208.1 |
| 5,463,484 | * | 10/1995 | Brody ..................................... 359/68 |
| 5,481,129 | * | 1/1996 | Dejong ................................. 257/360 |
| 5,695,690 | * | 12/1997 | Swirbel ................................ 252/582 |
| 5,714,284 | * | 2/1998 | Hirsh ....................................... 430/5 |
| 5,721,601 | * | 2/1998 | Yamaji ................................. 349/138 |
| 5,756,239 | * | 5/1998 | Wake ....................................... 430/7 |
| 5,790,219 | * | 8/1998 | Yamagishi ........................... 349/106 |
| 5,958,798 | * | 9/1999 | Shields ................................. 438/710 |
| 6,030,852 | * | 2/2000 | Sano ....................................... 438/69 |
| 6,033,813 | * | 3/2000 | Endo ....................................... 430/7 |

* cited by examiner

Primary Examiner—Mary Wilczewski
Assistant Examiner—David Goodwin
(74) Attorney, Agent, or Firm—Thomas, Kayden, Horstemeyer & Risley, LLP

(57) ABSTRACT

A reworking method to remove color filter film from a complementary metal-oxide semiconductor (CMOS) image sensor. In this method, the color filter film, including a planar film and a color film, is formed after the passivation of a CMOS device. Whether the color filter film is pre-baked or not, the reworking method of the invention is suitable. The method includes a plasma process, a solvent process, and a plasma process, which are sequentially performed.

23 Claims, 3 Drawing Sheets

PROCESSING FLOW OF A COMPLEMENTARY METAL-OXIDE SEMICONDUCTOR COLOR FILTER

CROSS-REFERENCE TO RELATED APPLICATION

This application claims the priority benefit of Taiwan application serial no. 87108824, filed Jun. 4, 1998, the full disclosure of which is incorporated herein by reference.

BACKGROUND OF THE INVENTION

1. Field of the Invention

This invention relates to a processing flow of a complementary metal-oxide semi-conductor (MOS) color filter, and more particularly to using several sequential processes of plasma, solvent, and plasma to effectively remove the complementary MOS (CMOS) color filter.

2. Description of Related Art

Currently, an image sensor generally takes an image through a charge-coupled device (CCD). The technology of CCD has been developed for many years and is mature. Compared with the CCD, another kind of image sensor, a CMOS image sensor, developed relatively late so that the resolution and quality are not yet as good as the CCD. Even so, the CMOS image sensor still has its many advantages such as lower fabrication costs due to the application of the CMOS fabrication process. The technology of the CMOS image sensor is under development, and it is predicted that the CMOS image sensor will take the place of the CCD to play the main role in the future. The CMOS image sensor is expected to be especially easy to match with the next generation of integrated circuit (IC) chips, used for image-processing or other purposes. The integration of IC devices can therefore be greatly increased. Fabrication costs are thereby brought down, dimensions are reduced, and power consumption is decreased. All these advantages enlarge the value of IC device.

In a conventional CMOS fabrication process, after the N-channel MOS (NMOS) and P-channel MOS (PMOS) are fabricated, a number fabrication processes are subsequently performed including, for example, depositing borophosphorsilicate glass (BPSG), thermal flowing, performing IC metallization, and depositing passivation. Then a bonding pad in the IC chip is exposed by photolithography and etching to ease a packaging process to complete the IC chip, which includes several hundred IC units.

The conventional CMOS used in the image sensor can only sense two colors: white or black. If it is desired for a CMOS to sense colors, the CMOS needs an additional process to form a color filter film on it with color sensitivities of red, green, and blue.

FIG. 1 is a flow diagram showing the conventional fabrication of color filter film on the CMOS device. In FIG. 1, the flow diagram starts from a step 10, in which the CMOS is fabricated including, for example, performing IC metallization and depositing $Si_3N_4$ by plasma enhanced chemical vapor deposition (PECVD) to form a passivation layer to protect the CMOS device. In a next step 12, a planar film is formed over the CMOS device by, for example, coating. In the next step 14, three color films, including red R, green G, and blue B are formed. The planar film and the color films form a color filter film. In a next step 16, a passivation layer is formed to protect the color filter film. Then, in a next step 18, the bonding pad is exposed by photolithography and etching. In the above sequential steps, the planar film and the color films including red, green, and blue films, made of, for example, acrylic, together form the color sensing filter film.

The red, green and blue color films are of a negative photoresist type corresponding to their colors. If these color films are exposed, a polymer is formed. The polymer can not be completely removed by plasma or solvent, which are typically used in the CMOS fabrication process. On the other hand, if the color films are not exposed and removal is the color films of the color filter film can be removed by a developer. However, after a high temperature curing process, the planar film cannot be removed by the solvent usually used in a CMOS fabrication process.

If a fabrication error is found, the acrylic color filter film, which is also a kind of photoresist, must be removed. This is called reworking. In order to remove the photoresist, one may make use of the conventional patterning photoresist method to remove the acrylic color filter film but some problems persist.

FIG. 2 is a flow diagram schematically illustrating the conventional processes for patterning the photoresist layer used in CMOS fabrication. In FIG. 2, the flow diagram starts from a step 20, in which the photoresist pattern is patterned. If the photoresist has not been pre-baked at a step 22, the photoresist can be removed by a solvent such as acetone, as show in a step 24. If photoresist has been pre-baked at a step 26, then a plasma process is necessary to remove most of the photoresist as stated in a step 28. Then, a solvent removes the residual photoresist as shown in a step 30.

As described above, the conventional patterning photoresist method can remove the photoresist but it can not effectively be applied to removing the color filter film because the color filter film is made of acrylic. For example, the plasma process, no matter how long it is applied, can not completely remove the acrylic photoresist. So, a flaw occurs in the subsequent fabrication process and causes the rejection or failure of the IC chip.

SUMMARY OF THE INVENTION

It is therefore an objective of the present invention to provide a method for removing the color filter film of the CMOS image sensor to effectively remove an acrylic color filter film.

It is another an objective of the present invention to provide a method for removing the color filter film of a CMOS image sensor using a few sequential processes including plasma, solvent, and plasma. The present invention provides a method to effectively remove acrylic color filter film so that the fabrication error, caused by the residual acrylic color filter film, is avoided.

In accordance with the foregoing and other objectives of the present invention, the method for removing the color filter film of CMOS image sensor includes a few sequential processes of plasma, solvent, and plasma to effectively remove acrylic color filter film. Whether the acrylic color filter film is pre-baked or not, the method of the invention works.

The method includes a passivation layer, a planar film, and a color film which are sequentially formed over a transistor. The planar film and the color film form the color filter film. Then, the color filter film is patterned. Then, a thermal treatment process is performed to increase the density of the color filter film. Then, a first plasma process removes most of the photoresist, which is the color filter film. Then a solvent process is performed to soften the residual color filter film on the passivation layer. Then a second plasma process is performed to remove the residual color filter film.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1:
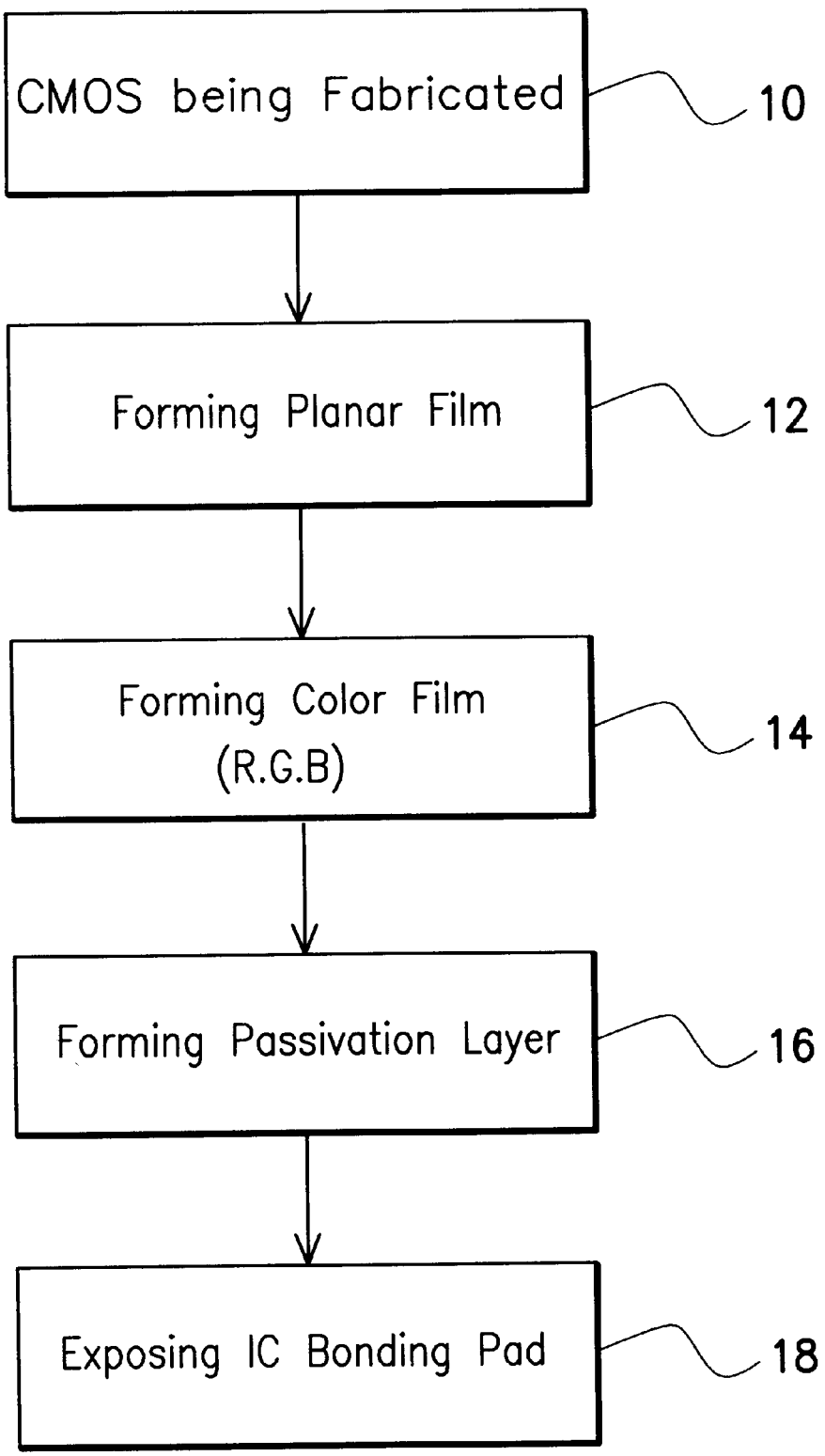
FIG. 1 is a flow diagram showing the conventional fabrication of color filter film on the CMOS device.
Figure 2:
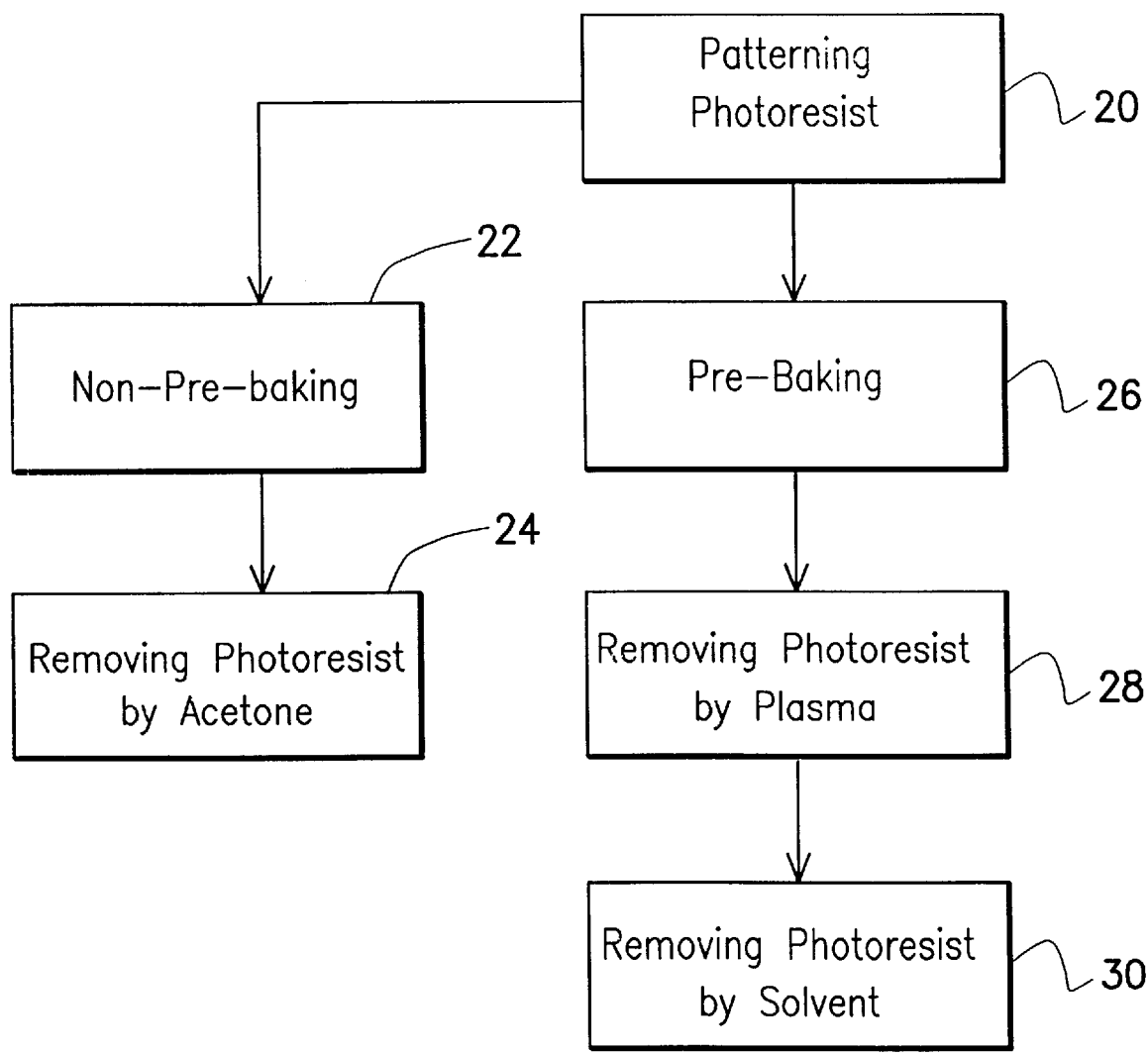
FIG. 2 is a flow diagram schematically illustrating a few conventional processes for patterning the photoresist layer used in CMOS fabrication.
Figure 3:
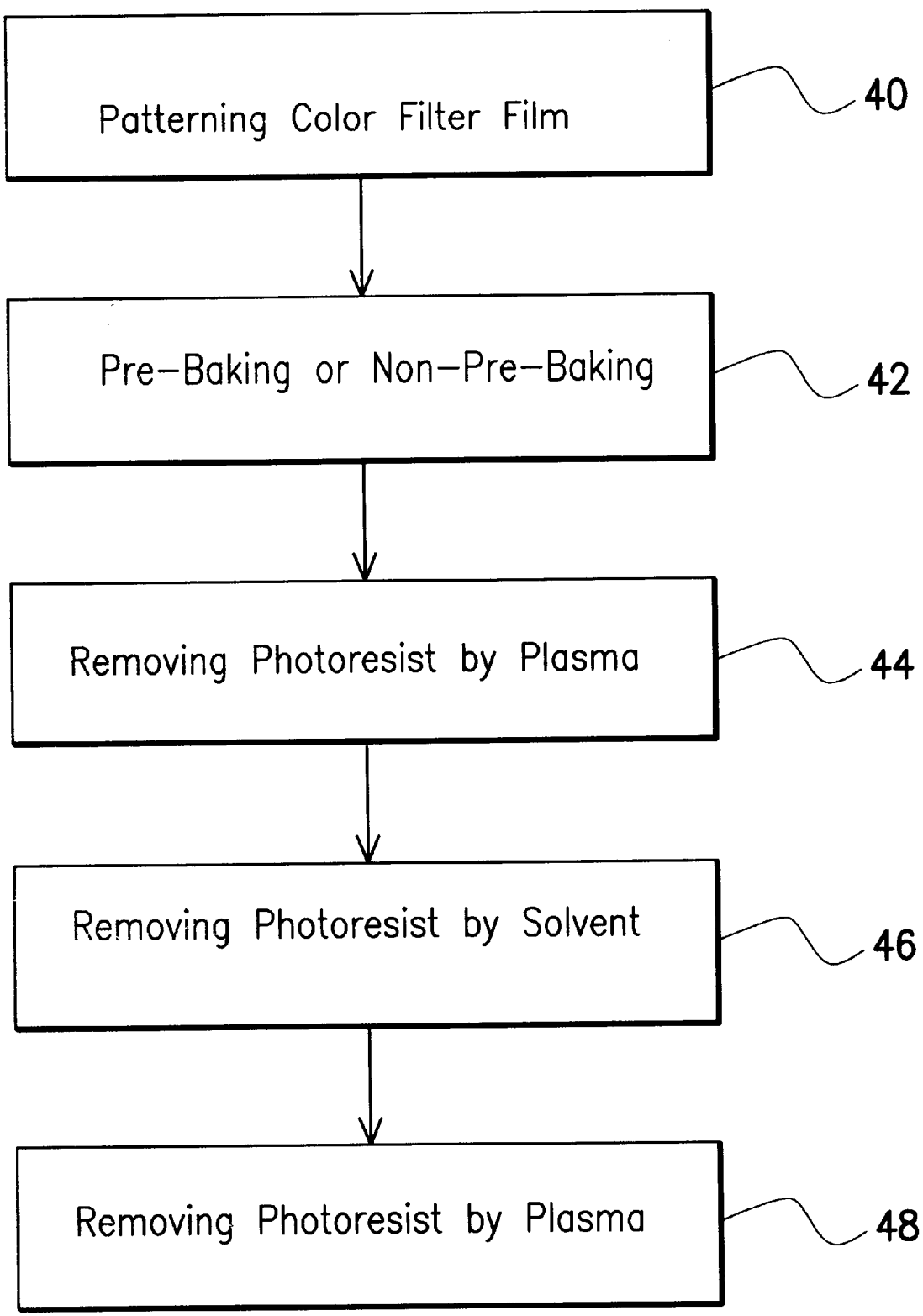
FIG. 3 is a flow diagram schematically illustrating the reworking processes for the CMOS color filter film, after patterning the photoresist pattern, according to the preferred embodiment of the invention.

During fabricating the color filter film of the CMOS image sensor, as described in FIG. 1 and FIG. 2, if a fabrication error is found, the acrylic color filter film must reworked to remove the color filter film. The FIG. 3 is a flow diagram schematically illustrating the reworking processes for the CMOS color filter film, after patterning the photoresist pattern, according to the preferred embodiment of the invention. Referring to FIG. 3, the reworking flow starts at a step 40, in which a pattern of color filter film is patterned. Then, in a step 42, whether a thermal treatment process is performed on the color filter film or not, the reworking flow of the invention is always suitable. A thermal treatment process, such as curing, is a prebaking process to increase the color filter film density. Then, in a step 44, an oxygen plasma process is performed to remove most of the color filter film.

The color films of red, green, and blue with their color resisting properties and the planar film are usually made of acrylic. Because acrylic is chemically resistant after exposure and curing, acrylic cannot be removed by the usual solvent in high temperature conditions, an oxygen plasma process 44 is performed to remove the color filter film. Then, a solvent process 46 is performed to soften the residual color filter film. Then another oxygen plasma process 48 is performed to remove the remaining color filter film.

After the step 48, the color filter film is fully removed. A new fabrication procedure as illustrated in FIG. 1 can be performed on the same IC chip to accomplish the fabrication of the color filter film of the CMOS image sensor. Therefore, the reworking method of the invention allows a flawed color filter film to be reworked without condemning the IC chip.

In conclusion, the reworking method of the invention is characterized by the fact that, whether a thermal treatment process is performed or not, the planar film and the color filter film can always be removed using several sequential processes of plasma, solvent and plasma.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A reworking method for removing a color filter film of a complementary metal-oxide semiconductor (CMOS) image sensor, the method comprising:

providing a transistor main device, on which the color filter film and a TiN passivation layer are sequentially formed;

patterning the color filter film;

performing a thermal treatment process;

performing a first plasma process for removing a portion of the color filter film;

performing a solvent process to soften the color filter film; and performing a second plasma process for removing the remaining portion of the color filter film.

2. The reworking method of claim 1, wherein the color filter film comprises a planar film and a color film.

3. The reworking method of claim 2, wherein the planar film comprises an acrylic material.

4. The reworking method of claim 2, wherein the color film comprises an acrylic material.

5. The reworking method of claim 2, wherein the color film comprises a red film, a green film and a blue film.

6. The reworking method of claim 2, wherein the formation of the planar film comprises a coating process.

7. The reworking method of claim 2, wherein the formation of the color film comprises a coating process.

8. The reworking method of claim 1, wherein the formation of the passivation layer comprises plasma enhanced chemical vapor deposition (PECVD).

9. The reworking method of claim 1, wherein the color filter film comprises an acrylic material.

10. The reworking method of claim 1, wherein the thermal treatment process comprises a curing process.

11. The reworking method of claim 1, wherein the first plasma process comprises an oxygen plasma process.

12. The reworking method of claim 1, wherein the second plasma process comprises an oxygen plasma process.

13. A reworking method for removing a color filter film of a complementary metal-oxide semiconductor (CMOS) image sensor, the method comprising:

providing a transistor main device, on which the color filter film and a TiN passivation layer are sequentially formed;

patterning the color filter film;

performing a first plasma process for removing a portion of the color filter film;

performing a solvent process to soften the color filter film; and performing a second plasma process for removing the remaining portion of the color filter film.

14. The reworking method of claim 13, wherein the color filter film comprises a planar film and a color film.

15. The reworking method of claim 14, wherein the planar film comprises an acrylic material.

16. The reworking method of claim 14, wherein the color film comprises an acrylic material.

17. The reworking method of claim 14, wherein the color film comprises a red film, a green film and a blue film.

18. The reworking method of claim 14, wherein the formation of the planar film comprises a coating process.

19. The reworking method of claim 14, wherein the formation of the color film comprises a coating process.

20. The reworking method of claim 13, wherein the formation of the pasivation layer comprises plasma enhanced chemical vapor deposition (PECVD).

21. The reworking method of claim 13, wherein the color filter film comprises an acrylic material.

22. The reworking method of claim 13, wherein the first plasma process comprises an oxygen plasma process.

23. The reworking method of claim 13, wherein the second plasma process comprises an oxygen plasma process.

\* \* \* \* \*